United States Patent [19]
Sato

[11] Patent Number: 5,272,115
[45] Date of Patent: Dec. 21, 1993

[54] METHOD OF LEVELING THE LAMINATED SURFACE OF A SEMICONDUCTOR SUBSTRATE

[75] Inventor: Fumihide Sato, Tokyo, Japan

[73] Assignee: NEC Corporation, Tokyo, Japan

[21] Appl. No.: 816,035

[22] Filed: Dec. 30, 1991

[30] Foreign Application Priority Data

Jan. 9, 1991 [JP] Japan .................................. 3-795

[51] Int. Cl.⁵ .................................................. H01L 21/00
[52] U.S. Cl. ..................................... 437/228; 437/190;
156/626; 156/643; 156/644; 156/653
[58] Field of Search ............... 156/644, 643, 653, 626; 437/225, 228, 190

[56] References Cited

U.S. PATENT DOCUMENTS

| | | | |
|---|---|---|---|
| 4,479,848 | 10/1984 | Otsubo et al. | 156/643 |
| 4,946,550 | 8/1990 | Van Laarhoven | 156/644 |
| 4,965,226 | 10/1990 | Gootzen et al. | 437/190 |
| 4,975,141 | 12/1990 | Greco et al. | 156/656 |
| 5,169,491 | 12/1992 | Doan | 156/636 |

FOREIGN PATENT DOCUMENTS

61-194748 8/1986 Japan .

OTHER PUBLICATIONS

S. K. Ghandhi, *VLSI Fabrication Principles*, John Wiley and Sons, New York, 1983, pp. 504–510.
Tummala et al., ed., *Microelectronics Packaging Handbook*, Van Nostrand Reinhold, New York, 1989, pp. 560–565.

*Primary Examiner*—Brian E. Hearn
*Assistant Examiner*—Laura M. Holtzman
*Attorney, Agent, or Firm*—Laff, Whitesel, Conte & Saret

[57] ABSTRACT

Disclosed is an improved method of leveling the laminated surface of a semiconductor substrate, which method permits the exact controlling of the etching of the lamination on the semiconductor substrate by detecting the sudden change of the amount of the gas resulting from the chemical reaction of the materials of the different layers with particular selected elements of surrounding plasma gas, thus assuring the reproducibility of leveled semiconductor substrate surface.

4 Claims, 3 Drawing Sheets

METHOD OF LEVELING THE LAMINATED SURFACE OF A SEMICONDUCTOR SUBSTRATE

BACKGROUND OF THE INVENTION

1. Field of the Invention

The present invention relates to a method of making semiconductor devices, and more particularly to a method of leveling the laminated surface of a semi-conductor substrate, thereby providing a leveled surface on which wiring conductors are to be attached.

2. Description of the Prior Art

One example of such leveling method is described with reference to FIG. 2a and 2b. As seen from FIG. 2a, a silicon substrate 1 has aluminum wiring conductors 2 of different widths attached to its top surface. A relatively thick insulating film 10 is formed on the surface of the semiconductor substrate 1. Finally, a coating layer 11 is formed on the insulating film 10. The lamination o the silicon substrate 1 is subjected to ion etching, which is carefully conditioned so as to permit the etching away of the different materials of the insulating and coating layers at a same rate. FIG. 2b shows a section of the insulating film 10 thus leveled. This leveling method has following defects: first, the insulating film must be very thick, and thick enough to prevent undesired exposure of aluminum wiring conductors 2 when the insulating film is etched out deeply at selected areas because the etching rate is liable to vary from place to place; second, the overlying coating layer must be very thick because otherwise, its contour would be similar to the underlying irregular contour of the insulating film 10, thus allowing uneven etching-out of the lamination on the substrate; third, the insulating film 10 remains so thick over aluminum conductors 2 that contact or through holes when made deep enough to reach such aluminum conductors 2 will be inevitably deep and large in size, thus sometimes preventing lead wires from reaching underlying conductors, and causing underside space between lead wires and surrounding hole to allow invasion of moisture in contact regions; fourth, the etching away of the two different materials at same rate is very difficult; and fifth, the critical point at which the etching away of the lamination must be stopped cannot be determined with accuracy, and therefore, it is most likely that the etching away is stopped at a premature stage with the result that the leveling is remote from satisfaction.

Another examples of levelling method are illustrated in FIG. 3a and 3b. As seen from FIG. 3a, a silicon substrate 1 has aluminum wiring conductors 2 attached to its surface and a relatively thick coating layer 11 formed on the surface of the semiconductor substrate 1 and the aluminum wiring conductors 2 thereon. Lest the coating layer 11 should be influenced by the underlying irregularity, the coating layer 11 must be thick enough for its upper surface to become substantially flat. The coating layer 11 is used as insulating layer to which another aluminum wiring conductors are to be attached. This insulating layer 11, however, is porous, allowing invasion of moisture to deteriorate the quality of insulation.

In an attempt to avoid this the porous layer 11 is sandwiched between lower and upper insulation films 12A and 12B. This, however, makes it difficult to make through holes, and the porous inner surface of the through hole surrounding the lead wire is exposed to the atmosphere, releasing the remaining volatile substance or moisture from the porous inner surface with the result that the quality of wiring connection is lowered.

SUMMARY OF THE INVENTION

It is, therefore, an object of the present invention to provide a leveling method which permits the accurate controlling of etching away of the lamination on a semiconductor substrate to provide a leveled surface on which wiring conductors are to be fixed.

To attain this object of the present invention a method of leveling the laminated surface of a semiconductor substrate according to the present invention comprises the steps of: preparing a semiconductor substrate having a plurality of wiring conductors attached thereto; forming a first insulating film on the surface of the semiconductor substrate and said wiring conductors; forming on said first insulating film, a second insulating film of a material which is different from the material of said first insulating film; forming a coating layer on said second insulating film; subjecting the whole area of said coating layer to a first ion etching within a first plasma gas atmosphere; detecting the exposure of the part or parts of said second insulating film at its highest level from the sudden change of the amount of the gas resulting from the chemical reaction of the material of said coating layer with a selected element of the first plasma gas to stop said first ion etching; subjecting the whole area of the remaining lamination to a second ion etching in a second plasma gas atmosphere, the rate at which the material of said second insulating film is etched away being selected to be larger than the rate at which the material of said coating layer is etched away; and detecting the exposure of the part or parts of said first insulating film at its highest level from the sudden change of the amount of the gas resulting from the chemical reaction of the material of said first film with a selected element of the second plasma gas to stop said second ion etching, thus substantially leveling the laminated surface of said semiconductor substrate.

According to one aspect of the present invention it further comprises the steps of: removing the remaining coating material from the upper surface of said second film; and forming an insulating film on said second film and the exposed part or parts of said first insulating film.

According to another aspect of the present invention said second ion etching is anisotropic.

According to still another aspect of the present invention said second ion etching is isotropic.

Other objects and advantages of the present invention will be understood from the following description of leveling methods according to preferred embodiments of the present invention.

DETAILED DESCRIPTION OF PREFERRED EMBODIMENTS

Figure 1A:
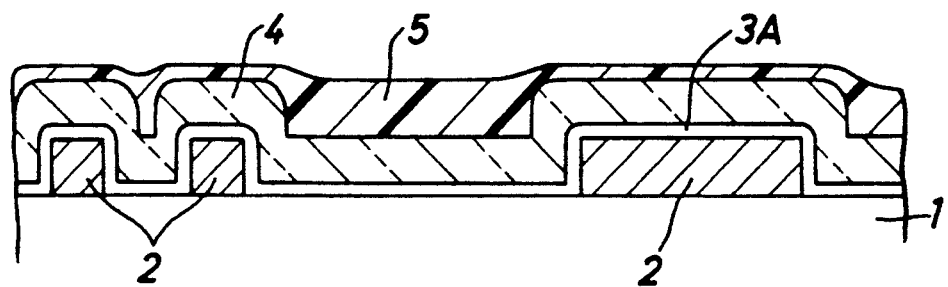
FIGS. 1a to 1d show how the laminated surface of a semiconductor substrate is leveled according to the present invention.

Referring to FIG. 1a, a semiconductor substrate 1 has a composite lamination on its upper surface. Specifically aluminum wiring conductors of different widths 2 are attached to the upper surface of the semiconductor substrate 1; a first insulating film 3A of impurity-free silicon oxide is formed on the upper surface of the semiconductor substrate 1 and the aluminum wiring conductors 2; a second insulating film 4 of silicon oxide doped with phosphorus and boron (called "boron phosphrous silica glass, and abbreviated "BPSG") is formed on the first insulating film 3A; and finally a coating layer 5 of novolak is formed on the second insulating film 4. The first and second insulating films 3A and 4 may be formed one after another according to the plasma chemical vapor deposition process. Assume that the minimum space between adjacent conductors 2 is 800 nm and that conductors 2 are 500 nm thick. Then, the thickness of the first silicon oxide film 3A ranges from 100 to 300 nm, and the thickness of the second BPSG film 4 ranges from 300 to 800 nm. The individual thicknesses are so selected that the total thickness of these films may range from 500 to 700 nm. The surface of the second BPSG film 4 may be coated with a relatively low-viscous novolak resin such as commonly used as photoresist on the condition that a 500 nm-thick coating would result if it were a flat surface.

Figure 1B:
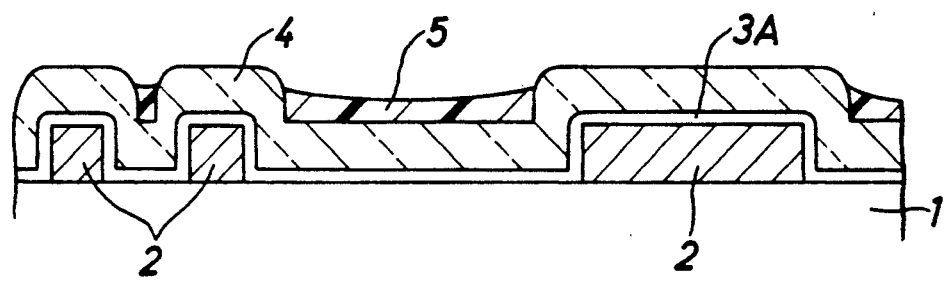

Referring to FIG. 1b, the whole area of the resin coating layer 5 is subjected to an ion etching within oxygen plasma. The amount of the light of 451 nm wave length which is characteristic of carbon monoxide is monitored with the aid of a spectrometer to determine when the amount of the characteristic light decreases drastically, stopping the ion etching. Then, the part or parts of the second insulating film 4 at its highest level are exposed. The sudden decrease of the amount of carbon dioxide resulting from the chemical reaction of carbon in the resin of the coating layer 4 with the surrounding oxygen is attributable to removal of the coating resin from the peaks of the second insulating layer 4 and exposure of the peaks of the BPSG layer 4, which contains no carbon. Thus, the critical controlling of the ion etching can be effected with ease and accuracy.

Figure 1C:
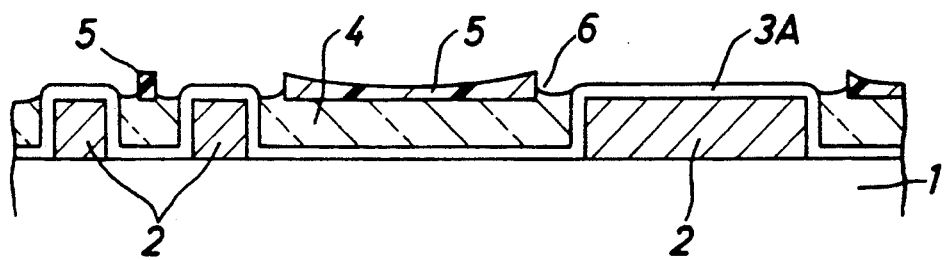
Figure 1D:
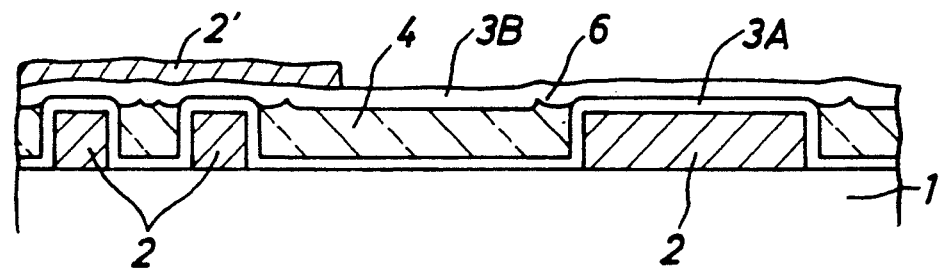
Figure 2A:
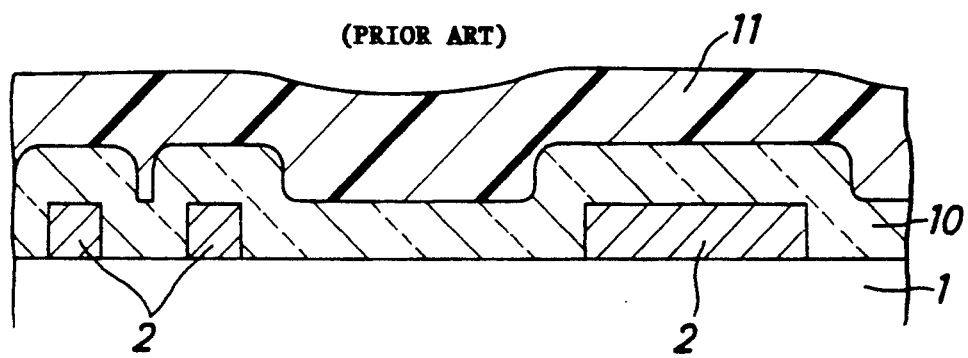
FIGS. 2a and 2b show how the top laminated surface of a semiconductor substrate is leveled according to a conventional leveling method.
Figure 2B:
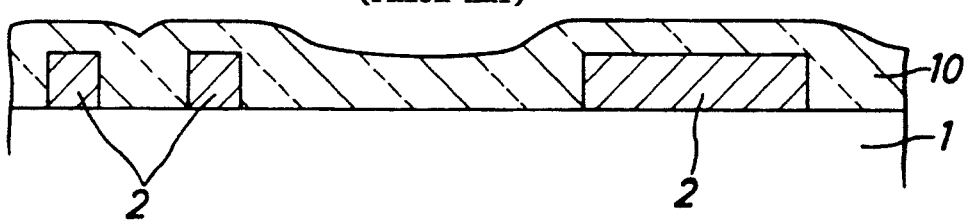
Figure 3A:
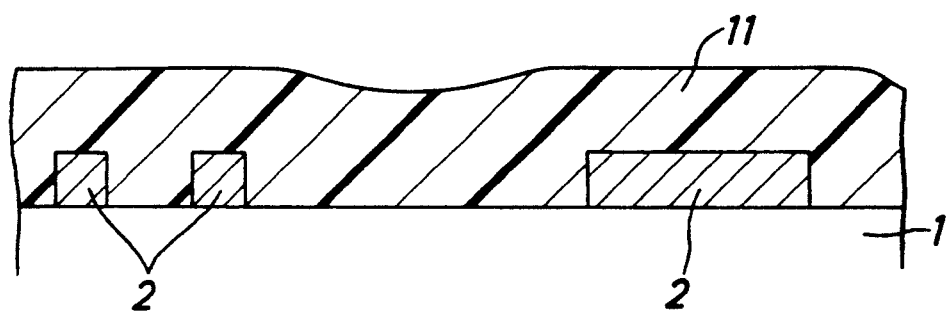
FIG. 3a shows, in section, a semiconductor substrate whose upper surface is leveled according to another conventional leveling method.
Figure 3B:
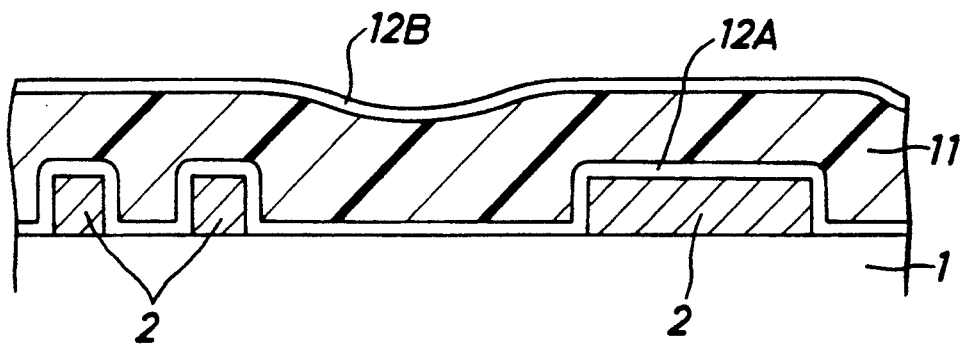
FIG. 3b shows, in section, a semiconductor substrate whose upper surface is leveled according to still another conventional leveling method.

Referring to FIG. 1c, the whole area of the remaining lamination is subjected to another ion etching within a mixture plasma of CF4+CHF3 +Ar. The rate at which the material of the BPSG film 5 is etched away is selected to be about two times larger than the rate at which the resin of the coating layer 5 is etched away. As is the case with the first ion etching, the amount of the light of 451 nm wave length which is characteristic of carbon monoxide is monitored with the aid of a spectrometer to determine when the amount of the characteristic light decreases drastically, stopping the ion etching to provide a substantially leveled surface with the peak or peaks of the first insulating film 3A exposed. The sudden increase of the amount of carbon monoxide resulting from the chemical reaction of carbon in the surrounding gas with the silicon oxide of the first insulating film 3A indicates removal of the BPSG film from the peaks of the first insulating layer 3A and exposure of the peaks of the silicon oxide film 3A, which contains carbon. Thus, the critical controlling of the second ion etching can be effected with ease and accuracy, too.

Preferably the remaining coating material 5 may be removed from the upper surface of the second film 4, and another silicon oxide film 3B may be formed on the second film 4 and the exposed peaks of the first insulating film 3A according to the plasma chemical vapor deposition process until the resulting insulating film 3B has been thick enough to provide good insulation between underlying and overlying wiring conductors 2 and 2'.

In the illustrated example the second ion etching is anisotropic, and therefore, the rising parts 6 of BPSG appear between the remaining coating material 5 and the second insulating film 4. Such rising parts 6 are minute and almost negligible from the point of leveling view. However, such rising parts 6 can be removed if the second ion etching is isotropic.

As may be understood from the above, the leveling method according to the present invention permits the critical controlling of the etching away of selected materials in the composite lamination on a semiconductor substrate, thus assuring the reproducibility of leveled semiconductor substrate surface. The faster etching away of the second film material has the effect of preventing appearance of the overlying coating irregularity on the leveled surface even if the coating layer is not thick. Also, the amount which is etched away is reduced compared with the conventional leveling methods, and accordingly the eating rate may remain constant over the whole area to be etched.

What is claimed is:

1. A method of leveling a laminated surface of a semiconductor substrated comprising the steps of:
   preparing a semiconductor substrate having a plurality of wiring conductors attached thereto;
   forming a first insulating film on the surface of the semiconductor substrate and said wiring conductors, said first insulating film being an impurity-free silicon oxide;
   forming a second insulating film of a material which is different from the material of said first insulating film, said second insulating film being a silicon oxide doped with phosphorus and boron;
   forming a coating layer on said second insulating film, said coating layer being novolak;
   subjecting the whole area of said coating layer to a first ion etching within a first plasma gas atmosphere, said first plasma gas being oxygen gas;
   detecting an exposure of a part or parts of said second insulating film at its highest level from a sudden change of an amount of a gas resulting from a chemical reaction of the material of said coating layer with a selected element of the first plasma gas to stop said first ion etching;
   subjecting the whole area of the remaining lamination to a second ion etching in a second plasma gas atmosphere, said second plasma gas being a mixture of CF4+CHF3+Ar;
   the rate at which the material of said second insulating film is etched away being selected to be greater than the rate at which the material of said coating layer is etched away; and
   detecting an exposure of a part or parts of said first insulating film at its highest level from a sudden change of an amount of a gas resulting from a chemical reaction of the material of said first film with a selected element of the second plasma gas to stop said second ion etching, thus substantially leveling the laminated surface of said semiconductor substrate; and the exposures of said second and first insulating films being detected from a sudden change of the amount of light having a wave length of 451 nm, which is characteristic of carbon monoxide.

2. A method of leveling the laminated surface of a semiconductor substrate according to claim 1 wherein it further comprises the steps of: removing the remaining coating material from the upper surface of said second insulating film; and forming a third insulating film on said second film and the exposed part of parts of said first insulating film.

3. A method of leveling the laminated surface of a semiconductor substrate according to claim 1 wherein said second ion etching is anisotropic.

4. A method of leveling a laminated surface of a semiconductor substrate comprising the steps of:

preparing a semiconductor substrate having a plurality of wiring conductors attached thereto;

forming a first insulating film on the surface of the semiconductor substrate and said wiring conductors, said first insulating film being an impurity-free silicon oxide;

forming a second insulating film of a material which is different from the material of said first insulating film, said second insulating film being a silicon oxide doped with phosphorus and boron;

forming a coating layer on said second insulating film, said coating layer being novolak;

subjecting the whole area of said coating layer to a first ion etching within a first plasma gas atmosphere, said first plasma gas being oxygen gas;

detecting an exposure of a part or parts of said second insulating film at its highest level from a sudden change of an amount of a gas resulting from a chemical reaction of the material of said coating layer with a selected element of the first plasma gas to stop said first ion etching;

subjecting the whole area of the remaining lamination to a second ion etching in a second plasma gas atmosphere, said second ion etching is isotropic;

the rate at which the material of said second insulating film is etched away being selected to be greater than the rate at which the material of said coating layer is etched away; and detecting an exposure of a part or parts of said first insulating film at its highest level from a sudden change of an amount of a gas resulting from a chemical reaction of the material of said first film with a selected element of the second plasma gas to stop said second ion etching, thus substantially leveling the laminated surface of said semiconductor substrate; and the exposure of said and first insulating films being detected from a sudden change of the amount of light having a wave length of 451 nm, which is characteristic of carbon monoxide.

* * * * *